US008710651B2

(12) United States Patent
Sakata et al.

(10) Patent No.: US 8,710,651 B2
(45) Date of Patent: Apr. 29, 2014

(54) SEMICONDUCTOR DEVICE AND METHOD FOR MANUFACTURING THE SAME

(75) Inventors: Kenji Sakata, Kanagawa (JP); Tsuyoshi Kida, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 277 days.

(21) Appl. No.: 12/904,680

(22) Filed: Oct. 14, 2010

(65) Prior Publication Data

US 2011/0084384 A1 Apr. 14, 2011

(30) Foreign Application Priority Data

Oct. 14, 2009 (JP) ................................. 2009-237128

(51) Int. Cl.
*H01L 29/66* (2006.01)
(52) U.S. Cl.
USPC .................................. 257/737; 257/E21.503
(58) Field of Classification Search
CPC ................................................... H01L 21/563
USPC ........................................ 257/737, E21.503
See application file for complete search history.

(56) References Cited

U.S. PATENT DOCUMENTS

| | | | |
|---|---|---|---|
| 6,448,665 B1 * | 9/2002 | Nakazawa et al. | 257/789 |
| 2002/0079590 A1 * | 6/2002 | Nakaoka et al. | 257/777 |
| 2002/0090162 A1 * | 7/2002 | Asada et al. | 385/14 |
| 2004/0164385 A1 * | 8/2004 | Kado et al. | 257/678 |
| 2007/0158855 A1 * | 7/2007 | Minamio et al. | 257/778 |
| 2007/0181992 A1 * | 8/2007 | Lake | 257/698 |
| 2008/0251913 A1 * | 10/2008 | Inomata | 257/737 |

FOREIGN PATENT DOCUMENTS

| | | |
|---|---|---|
| JP | 08-195414 | 7/1996 |
| JP | 2000-323624 | 11/2000 |
| JP | 2006147930 A | 6/2006 |
| JP | 2008277631 A | 11/2008 |
| JP | 2009049115 A | 3/2009 |

OTHER PUBLICATIONS

JP Office Action dated Feb. 19, 2013, with English translation; Application No. 2009-237128.
Japanese Office Action dated Nov. 19, 2013; Patent Appln No. 2013-084865; Reference No. 753203412.

* cited by examiner

*Primary Examiner* — Shaun Campbell
(74) *Attorney, Agent, or Firm* — Young & Thompson

(57) ABSTRACT

A semiconductor device includes a substrate, a semiconductor chip that is bonded to one of the faces of the substrate via bumps, and has a device formation face facing the one of the faces, and a resin that fills the space between the device formation face of the semiconductor chip and the one of the faces of the substrate. The resin includes: a first resin that is formed in a formation region of bumps placed on the outermost circumference of the bumps, and is formed inside the formation region, and a second resin that is formed outside the first resin. The thermal expansion coefficient of the substrate is higher than the thermal expansion coefficient of the first resin. The thermal expansion coefficient of the second resin is higher than the thermal expansion coefficient of the first resin.

15 Claims, 8 Drawing Sheets

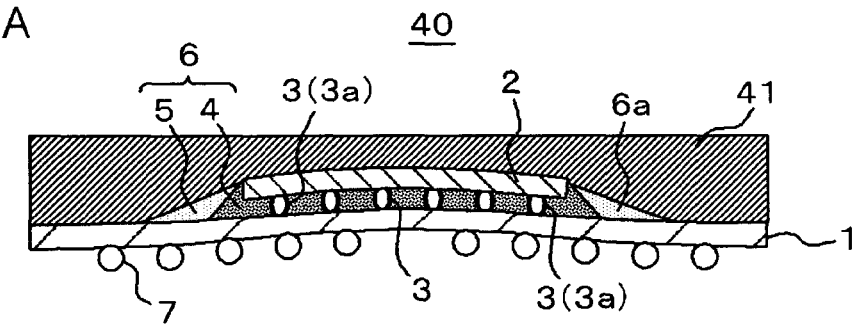
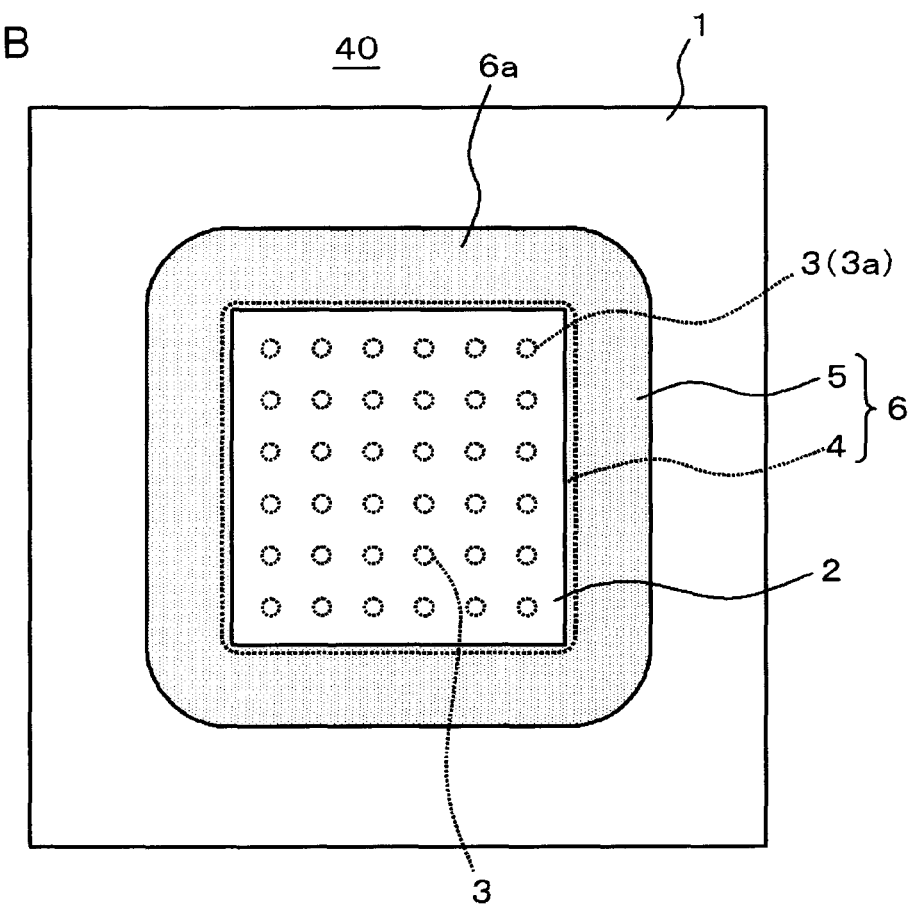

SEMICONDUCTOR DEVICE AND METHOD FOR MANUFACTURING THE SAME

This application is based on Japanese patent application No. 2009-237128, the content of which is incorporated hereinto by reference.

BACKGROUND

1. Technical Field

The present invention relates to a semiconductor device and a method for manufacturing the semiconductor device.

2. Related Art

In recent years, there has been an increasing demand for semiconductor devices (semiconductor packages (hereinafter referred to as packages)) each having a semiconductor chip (hereinafter referred to as a chip) and a semiconductor substrate (hereinafter referred to as a substrate) electrically connected to each other by a flip-chip process. Such semiconductor packages are demanded as small-area, thin packages that can be mounted at a high density.

The flip-chip process can be performed in the following manner. First, the surface (the circuit formation face) of a chip and the interconnect face (the side on which the interconnects for the chip are formed) of a substrate are placed to face each other. The electrode pads formed on the surface of the chip are then bonded (flip-chip bonded) to the electrode pads formed on the interconnects of the substrate via bumps (connection media) made of solder, gold, copper, or the like.

The bumps for the flip-chip bonding are formed beforehand on the electrode pads of the chip or the electrode pads of the substrate, and have a certain height (5 to 100 µm). Therefore, after the chip is bonded to the substrate, a space is formed between the surface of the chip and the substrate.

The space is normally filled with a resin. The resin can physically protect the joining portions among the electrode pads of the chip, the bumps, and the electrode pads of the substrate. The resin can also prevent short-circuiting between adjacent electrodes due to remelting of the bumps and bridging between adjacent joining portions at the high temperature to which the package is exposed at the time of mounting.

Japanese Laid-Open Patent Publication No. 08-195414 discloses a package that is formed by placing the chip surface (the circuit surface) and the substrate interconnect face (the chip bonding face) to face each other, and flip-chip bonding the chip to the substrate. In this package, a first resin is placed in a first region that is surrounded by the outermost circumferential bumps, and a second resin is placed in a second region that is a region outside the outermost circumferential bumps. At least, the amount, the maximum particle size, or the mean particle size of the inorganic filler contained in the first resin is smaller than that of the second resin.

Japanese Laid-Open Patent Publication No. 08-195414 discloses that, in this structure, the modulus of elasticity of the first resin placed in the first region becomes lower while the thermal expansion coefficient of the first resin becomes higher, and accordingly, the shear deformation at the end portions of the resins caused by the temperature cycling can be made smaller. By the technique disclosed in Japanese Laid-Open Patent Publication No. 08-195414, the modulus of elasticity of the first resin is set at a low value, so as to minimize the residual stress between the chip and the first resin. Meanwhile, the thermal expansion coefficient of the second resin in contact with the end portions of the chip is set at a low value, so as to prevent a concentration of stress strain caused by thermal stress.

Japanese Laid-Open Patent Publication No. 08-195414 also discloses that, in this structure, the residual stress between the chip and the first resin can be made smaller, and detachment of the chip due to the residual stress can be restrained. Also, it is possible to prevent cracks and the like caused by a concentration of stress at the end faces of the chip due to the difference in thermal expansion coefficient.

Japanese Laid-Open Patent Publication No. 08-195414 also discloses that the amount of the inorganic filler contained in the second resin placed outside the bumps should be made larger than that in the first resin. By doing so, the moisture penetration path can be blocked, and the reliability in terms of moisture resistance is improved. Japanese Laid-Open Patent Publication No. 08-195414 further discloses that only the particle size of the inorganic filler of the first resin placed inside the bumps should be made smaller. By doing so, breaking of the chip can be restrained while the moisture blocking effect is maintained, and the injection performance of the resin can be improved.

SUMMARY

However, the present inventor has recognized as follows. According to the technique disclosed in Japanese Laid-Open Patent Publication No. 08-195414, at least, the amount, the maximum particle size, or the mean particle size of the inorganic filler contained in the second resin forming the fillet covering the peripheral portion of the chip is larger than that of the first resin placed at the center of the chip. Therefore, the thermal expansion coefficient of the second resin forming the fillet becomes lower than the thermal expansion coefficient of the first resin located at the center of the chip.

Meanwhile, the contraction stress of the fillet of the second resin formed at the peripheral portion of the chip is zero at the temperature at the time of resin hardening. When the substrate temperature drops to ordinary temperature after the hardening, if the thermal expansion coefficient of the second resin is higher than the thermal expansion coefficient of the substrate, contraction stress is generated in the fillet. Accordingly, the fillet has a certain effect to correct warpage of the substrate.

According to the technique disclosed in Japanese Laid-Open Patent Publication No. 08-195414, however, the effect to correct warpage of the substrate becomes smaller, as the thermal expansion coefficient of the second resin is lower than the thermal expansion coefficient of the first resin at the center of the chip. In other words, the substrate warpage correcting effect becomes smaller than in a case when the first resin is also used outside the outermost circumferential bumps, instead of the second resin, that is, the case when the amount, the maximum particle size, and the mean particle size of the inorganic filler contained in the resin are the same inside and outside the outermost circumferential bumps. As a result, the package mounting properties and the reliability after the mounting become poorer.

According to the technique disclosed in Japanese Laid-Open Patent Publication No. 08-195414, different resins fill the inside and the outside of the outermost circumferential bumps. However, if the two kinds of resins having different thermal expansion coefficients from each other are in contact with the same bump joining portion at both sides, the stress to be applied to the joining portion differs from the stress applied to a joining portion covered with of the same resin. Depending on the combination of resins, the joining portion might be broken.

As described above, it is difficult to restrain warpage of a substrate to increase the flatness of the substrate, and reduce the stress to be applied to the joining portions between a chip and the substrate due to the difference in thermal expansion coefficient between the first resin and the second resin.

In one embodiment, there is provided a semiconductor device including a substrate, a semiconductor chip that is bonded to one of faces of the substrate via a plurality of bumps, and has a device formation face facing the one of the faces, and a resin that fills a space between the device formation face of the semiconductor chip and the one of the faces of the substrate, the resin including a first resin that is formed in a formation region of a plurality of bumps placed on an outermost circumference of the bumps, and is formed inside the formation region, and a second resin that is formed outside the first resin, a thermal expansion coefficient of the substrate being higher than a thermal expansion coefficient of the first resin, a thermal expansion coefficient of the second resin being higher than the thermal expansion coefficient of the first resin.

In this semiconductor device, in the case of the thermal expansion coefficient of the substrate is higher than the thermal expansion coefficient of the first resin, a resin that has a higher thermal expansion coefficient than the thermal expansion coefficient of the first resin located inside is used as the second resin located outside. With this arrangement, the effect of the second resin to correct the warpage of the substrate can be made greater. Accordingly, the flatness of the substrate can be made higher. As a result, the yield and reliability of the semiconductor device in terms of mounting can be improved.

Since the first resin is formed in the formation region of the bumps located on the outermost circumference of all the bumps and is also formed inside the formation region, the joining portions between the chips including the bumps and the substrate are covered with the same resin, which is the first resin. With this arrangement, the stress to be applied to the joining portions due to the difference in thermal expansion coefficient between the resins can be restrained, though such stress cannot be restrained where two kinds of resins having different thermal expansion coefficients from each other are in contact with the same bump joining portion at both sides.

In another embodiment, there is provided a method for manufacturing a semiconductor device, including bonding a semiconductor chip to a substrate via a plurality of bumps, with a device formation face of the semiconductor chip facing one of faces of the substrate, and filling a space between the device formation face of the semiconductor chip and the one of the faces of the substrate with a resin, the filling the space including forming a first resin in a formation region of a plurality of bumps placed on an outermost circumference of the bumps and inside the formation region, the first resin having a lower thermal expansion coefficient than a thermal expansion coefficient of the substrate, and forming a second resin outside the first resin, the second resin having a higher thermal expansion coefficient than the thermal expansion coefficient of the first resin.

According to the present invention, warpage of the substrate can be restrained, and the flatness of the substrate can be made higher. Also, the stress to be applied to the joining portions between the chip and the substrate due to the difference in thermal expansion coefficient between the first resin and the second resin can be reduced.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 6A is a schematic front cross-sectional view of a semiconductor device according to a fourth embodiment;

FIG. 6B is a schematic plan view of the semiconductor device according to the fourth embodiment;

DETAILED DESCRIPTION

Figure 1A:
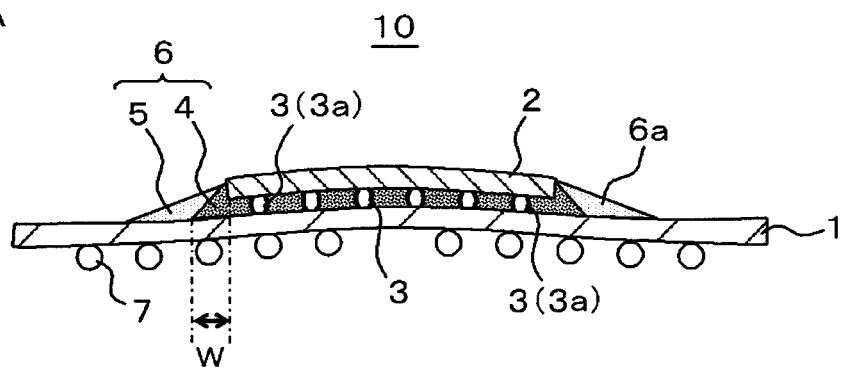
FIG. 1A is a schematic front cross-sectional view of a semiconductor device according to a first embodiment.

Before describing of the present invention, the related art will be explained in detail in order to facilitate the understanding of the present invention.

As described above, the resin is also designed to physically protect the joining portions, a resin material that has relatively low expansion properties and relatively high rigidity is used as the material of the resin. Examples of characteristic values of the resin include 135 to 145° C. in Tg (glass-transition temperature), 30 to 40 ppm/° C. in $\alpha 1$ (the linear expansion coefficient where the temperature is lower than Tg), 80 to 150 ppm/° C. in $\alpha 2$ (the linear expansion coefficient where the temperature is equal to or higher than Tg), and 5 to 10 GPa in E (the modulus of elasticity). As the temperature varies during the package manufacturing process after the flip-chip bonding procedure and during the package mounting process, thermal stress is applied to the joining portions due to the difference in thermal expansion coefficient (such as the linear expansion coefficient) between the chip and the substrate. However, since the resin has high rigidity as described above, the thermal stress can be reduced.

The methods of forming the resin to fill the space between the chip surface and the substrate are roughly classified into the following three types by the timing and process to supply the resin to the space.

According to the first method, the space between the chip and the substrate is filled with a resin in liquid form after the flip-chip bonding.

According to the second method, prior to the flip-chip bonding, a resin in liquid form is applied onto the substrate or a resin having a film-like shape is bonded onto the substrate.

When the flip-chip bonding is performed, the resin is supplied (placed) into the space between the chip and the substrate.

According to the third method, prior to the flip-chip bonding, a resin having a film-like shape is bonded to the chip surface or a resin in liquid form is applied onto the chip surface and is partially hardened. When the flip-chip bonding is performed, the resin is supplied (placed) into the space between the chip and the substrate.

The first method is now described in detail. First, the chip is flip-chip bonded to the substrate. When this bonding is performed, the chip and the substrate are normally heated to a temperature of 200 to 350° C. When the pre-product having the chip and the substrate integrally flip-chip bonded to each other is returned to ordinary temperature, the chip and the substrate have warpage caused by the thermal stress that is generated due to the difference in thermal expansion coefficient between the chip (3 to 5 ppm/° C. in α and 130 GPa in E, for example) and the substrate (15 to 25 ppm/° C. in α1, 5 to 35 ppm/° C. in α2, 120 to 150° C. in Tg, and 15 to 30 GPa in E, for example). Since the thermal expansion coefficient of a substrate is normally higher than the thermal expansion coefficient of a chip, the substrate has upwardly convex warpage at ordinary temperature, with the chip being placed on the substrate. When the resin fills the space between the chip and the substrate after the flip-chip bonding, the temperature of the pre-product is maintained at 40 to 100° C., and the resin is injected. To harden the resin after the injection, the temperature of the pre-product is normally maintained in the range of 100 to 200° C. As described above, the temperature of the resin at the time of injection and hardening is lower than the temperature of the resin at the time of flip-chip bonding. Therefore, at the time of resin injection and hardening, the substrate retains the upwardly convex warpage (though the warpage is made somewhat smaller than the warpage at ordinary temperature by the thermal contraction of the resin), with the chip being placed on the substrate.

Likewise, according to the second and third methods, the flip-chip bonding is performed at a temperature of 200 to 350° C., and the resin is then normally hardened at a temperature of 100 to 200° C. Therefore, the pre-product and the substrate have upwardly convex warpage after the flip-chip bonding, with the chip being placed on the substrate.

There is a strong demand for thinner packages particularly for the use in digital still cameras and portable telephones, for example. Therefore, packages that have chips bonded to substrates by a flip-chip process and have BGA (Ball Grid Array) balls attached to the back faces of the substrates are being often used. The BGA balls are designed for mounting the packages onto mounting substrates (not shown).

If a package has upwardly convex warpage, defective bonding might be caused between the BGA balls and the mounting substrate at the time of mounting, or the bonding between the BGA balls and the mounting substrate at the time of mounting might not be sufficient. As a result, the reliability of the device after the mounting becomes lower.

Defects caused at the time of package mounting are now described in greater detail. A mounting device for mounting a package onto a mounting substrate includes a mounting tool that adsorptively holds the package, and a flux container. Flux is stored in the flux container. When mounting is performed, the package is adsorptively held by the mounting tool, and is pushed into the flux container, to attach flux to the BGA balls. If the warpage of the package is large, flux does not adhere to all the BGA balls, but adheres only to some of the BGA balls. If the package is mounted on the mounting substrate in that situation, the bonding between the BGA balls having no flux attached thereto and the mounting substrate turns into defective bonding, and the package and the mounting substrate cannot be electrically connected to each other in a preferred manner. Therefore, to improve the device yield after the mounting and the device quality after the mounting, the warpage of the package, or the warpage of the substrate that is caused at the time of flip-chip bonding and is the largest cause of the warpage of the package, should be restrained.

Recently, chip thicknesses, the length of each one side of each chip, and substrate thicknesses are 60 to 200 μm, 5 to 12 mm, and 200 to 400 μm, respectively. As a result, a package of 14×14 mm in size might have warpage as large as 100 to 200 μm, and the coplanarity of the BGA balls becomes lower accordingly. Therefore, the above described problem in mounting is becoming more and more evident. Particularly, where the chip thickness is 150 μm or less and the chip size is 8 mm or more, the warpage becomes too large to ignore at the time of package mounting.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Embodiments of the present invention will be explained below, referring to the attached drawings. Note that any similar constituents will be given the same reference numerals or symbols in all drawings, and explanations therefor will not be repeated.

[First Embodiment]

Figure 1B:
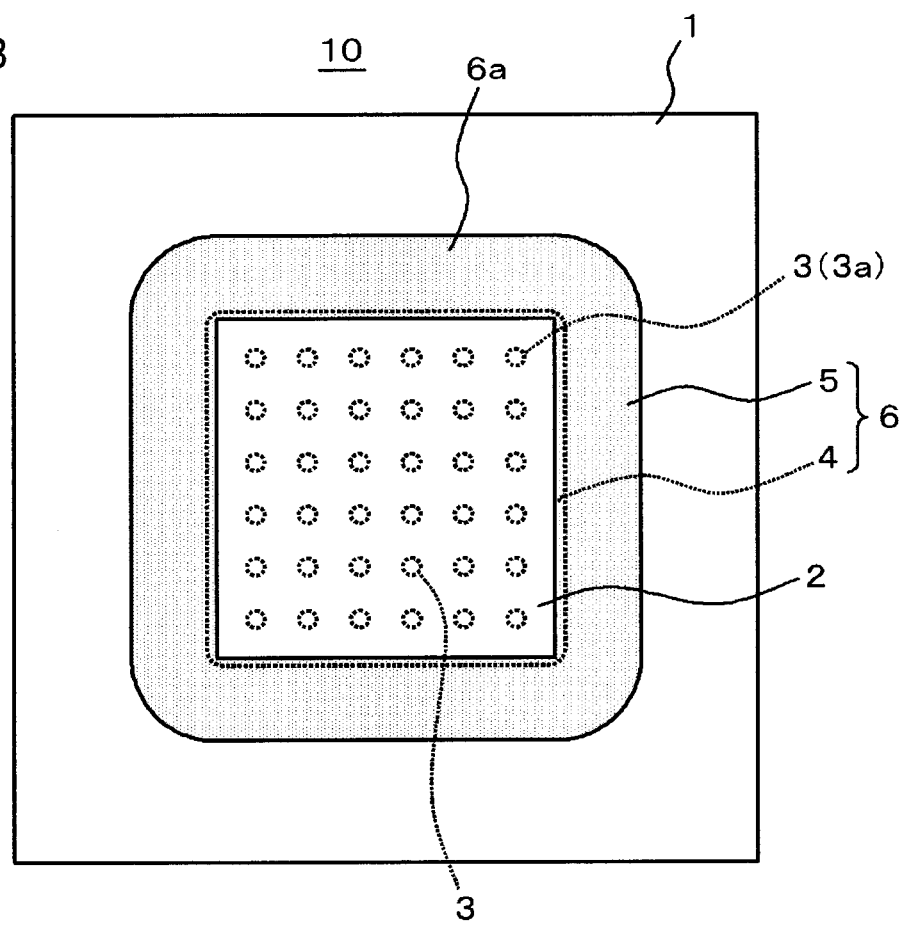
FIG. 1B is a schematic plan view of the semiconductor device according to the first embodiment.

FIGS. 1A and 1B are schematic views showing the structure of a semiconductor device 10 according to a first embodiment. FIG. 1A is a front cross-sectional view, and FIG. 1B is a plan view. FIGS. 2A through 2E are a series of process drawings (cross-sectional views) for explaining a method for manufacturing the semiconductor device according to the first embodiment.

The semiconductor device 10 according to this embodiment includes a substrate 1, a semiconductor chip 2 that is connected to one of the faces of the substrate 1 via bumps 3, and has a device formation face facing the one of the faces of the substrate 1, and a resin 6 that fills the space between the device formation face of the semiconductor chip 2 and the one of the faces of the substrate 1. The resin 6 includes a first resin 4 that is formed in the formation region of bumps 3a located on the outermost circumference of the bumps 3 and is also formed inside the formation region, and a second resin 5 that is formed outside the first resin 4. The thermal expansion coefficient of the substrate 1 is higher than the thermal expansion coefficient of the first resin 4. The thermal expansion coefficient of the second resin 5 is higher than the thermal expansion coefficient of the first resin 4.

The method for manufacturing the semiconductor device according to this embodiment includes a first process to connect the semiconductor chip 2 to the substrate 1 via the bumps 3 so that the device formation face of the semiconductor chip 2 faces one of the faces of the substrate 1, and a second process to fill the space between the device formation face of the semiconductor chip 2 and the one of the faces of the substrate 1 with the resin 6. The second process includes: a third process to form the first resin 4 in the formation region of the bumps 3a located on the outermost circumference of the bumps 3 and also form the first resin 4 inside the formation region, the first resin 4 having a lower thermal expansion coefficient than that of the substrate 1, and a fourth process to form the second resin 5 outside the first resin 4, the second resin 5 having a higher thermal expansion coefficient than that of the first resin 4.

In this specification, "resin" means both a resin injected through a nozzle and a resin having a film-like shape.

The following is a detailed description.

First, the structure of the semiconductor device 10 is described.

As shown in FIGS. 1A and 1B, the semiconductor device 10 according to this embodiment includes the substrate 1, the semiconductor chip (hereinafter referred to as the chip) 2, and the resin 6.

The chip 2 may be a structure that has a diffusion layer and an interconnect layer formed on a silicon substrate, and has an electrode pad portion formed on the interconnect layer. The bumps 3 for establishing electric connections with the substrate 1 are formed beforehand on the electrode pad portion. The face of the chip 2 on which the diffusion layer, the interconnect layer (including interconnects), the electrode pad portion, and the bumps 3 are formed (the lower face in FIG. 1A) forms the device formation face. In this embodiment, the bumps 3 are evenly arranged in a matrix fashion across the device formation face of the chip 2. In other words, the bumps 3 are arranged in a so-called "area-arrangement" manner (see FIG. 1B).

The bumps 3 may be formed with eutectic solder, lead-free solder, Au, Cu, or a complex of those materials, for example. However, any other material may be used for the bumps 3, as long as the chip 1 and the substrate 1 can be electrically connected.

In this embodiment, the bumps 3 are formed beforehand on the chip 2. However, the bumps 3 may be formed on electrode pads of the substrate 1, or may be formed beforehand on both the chip 2 and the electrode pads of the substrate 1.

The substrate 1 may be an interconnect substrate having interconnects formed on an organic substrate such as a glass epoxy substrate. However, it is also possible to use an interconnect substrate having interconnects formed on a polyimide tape or the like with plating.

The chip 2 is connected (flip-chip bonded) to one of the faces of the substrate 1 via the bumps 3 so that the device formation face of the chip 2 faces the one of the faces of the substrate 1 (the face having the interconnects formed thereon).

The size of the space between the chip 2 and the substrate 1 flip-chip bonded to each other is normally approximately 5 to 100 μm, depending on the height of the bumps 3.

The resin 6 fills the space between the device formation face of the chip 2 and the one of the faces of the substrate 1, and the spaces between adjacent bumps 3 or the spaces between adjacent joining portions.

The resin 6 includes the first resin 4 and the second resin 5.

The thermal expansion coefficient of the first resin 4 is lower than the thermal expansion coefficient of the substrate 1. In other words, the thermal expansion coefficient of the substrate 1 is higher than the thermal expansion coefficient of the first resin 4.

The first resin 4 is formed in the formation region of the bumps 3a located on the outermost circumference of the bumps 3 and is also formed inside the formation region. The second resin 5 is formed outside the first resin 4 (outside in the extending direction of the substrate 1 and the chip 2).

Accordingly, the first resin 4 covers the respective bumps 3. Meanwhile, the second resin 5 is not in contact with the bumps 3, and covers the outer portion of the first resin 4. The second resin 5 also covers the end portions (the outer peripheral portions) of the chip 2, for example.

In this embodiment, the second resin 5 does not enter the space between the chip 2 and the substrate 1 (the inside of the outer peripheral ends of the chip 2), for example, as shown in FIGS. 1A and 1B. In this case, the only second resin 5 does not fill the space between the device formation face of the chip 2 and the one of the faces of the substrate 1.

In this embodiment, the second resin 5 may enter the space between the chip 2 and the substrate 1 (inside the outer peripheral ends of the chip 2). In other words, the second resin 5 may also fill the space between the device formation face of the chip 2 and the one of the faces of the substrate 1. However, if the second resin 5 is in direct contact with the bumps 3 or the joining portions, the stress caused by the difference in a thermal expansion coefficient between the first resin 4 and the second resin 5 is applied to the joining portions. Therefore, the second resin 5 should not be in contact with the bumps 3 or the joining portions.

To protect the joining portions, a material having a low thermal expansion coefficient and high modulus of elasticity is used as the first resin 4. On the other hand, a material having a higher thermal expansion coefficient than that of the first resin 4 is used as the second resin 5.

If the modulus of elasticity of the second resin 5 is higher than that of the first resin 4, a greater warpage correcting effect is achieved. However, where the thermal expansion coefficient is made higher, the modulus of elasticity tends to become lower. As for the second resin 5, it is preferable to put priority not on an increase in modulus of elasticity but on an increase in thermal expansion coefficient, so as to increase the thermal contraction stress.

The thermal expansion coefficient of the second resin 5 may be $\alpha 1 > 40$ ppm/° C., $\alpha 2 > 150$ ppm/° C., for example. To achieve such characteristics for the second resin 5, the content ratio (weight %) of the inorganic filler in the second resin 5 should be made lower than that of the first resin 4, or the particle size (the mean particle size, the maximum particle size, or the like) of the inorganic filler contained in the second resin 5 should be made smaller than that of the first resin 4.

In this embodiment, as the thermal expansion coefficient of the second resin 5 becomes higher than that of the first resin 4, the thermal contraction stress of the second resin 5 becomes higher than that of the first resin 4. As a result, the warpage correcting effect of the substrate 1 achieved by virtue of the second resin 5 can be made higher than that in Japanese Laid-Open Patent Publication No. 08-195414. Accordingly, the warpage of the substrate 1 can be made smaller than that in Japanese Laid-Open Patent Publication No. 08-195414. Thus, the coplanarity of BGA (Ball Grid Array) balls 7 can be made lower, and occurrence of defects at the time of mounting can be appropriately restrained.

The sticking-out portion of the resin 6 formed around the chip 2 (the portion sticking out from the space between the chip 2 and the substrate 1) is normally called "fillet". In this embodiment, part of the first resin 4 and part of the second resin 5 form the fillet 6a, for example.

Next, the method for manufacturing the semiconductor device according to this embodiment is described.

Figure 2A:
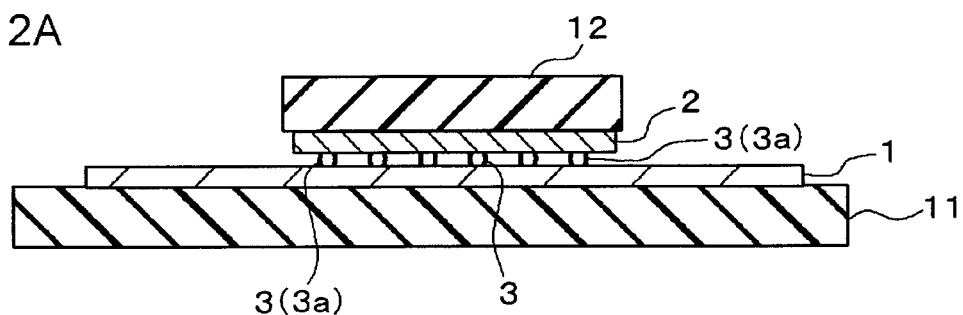
FIGS. 2A through 2E are a series of process drawings (cross-sectional views) for explaining a method for manufacturing the semiconductor device according to the first embodiment.

FIGS. 2A through 2E are a series of process drawings (cross-sectional views) for explaining the manufacturing method. For this manufacturing method, the mounting device illustrated in FIG. 2A is used, for example. This mounting device includes a substrate heating stage 11 and a chip heating tool 12. The substrate heating stage 11 heats the substrate 1 placed on the substrate heating stage 11. The chip heating tool 12 is capable of adsorptively holding the chip 2 on the side of the lower face of the chip heating tool 12. This chip heating tool 12 can be moved up and down by an elevating mechanism (not shown). This chip heating tool 12 also heats the held chip 2.

First, as shown in FIG. 2A, the substrate 1 is placed on the substrate heating stage 11, with the interconnect face of the substrate 1 facing upward. The chip 2 having the bumps 3 formed beforehand on its surface (its interconnect face) is adsorptively held by the chip heating tool 12, with the interconnect face of the chip 2 facing downward. In this situation, the chip heating tool 12 is moved down toward the substrate 1, so that the bumps 3 of the chip 2 are brought into pressure contact with electrode pads (not shown) on the interconnects of the substrate 1. Further, in this situation, the chip heating tool 12 heats the chip 2, and the substrate heating stage 11 heats the substrate 1.

Figure 2B:
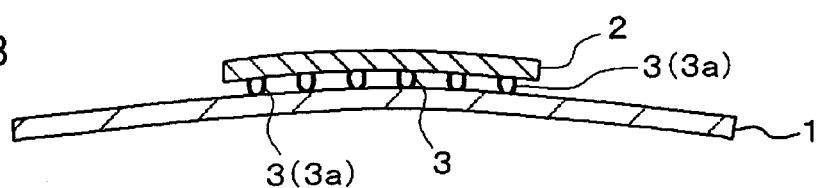

As a result, the chip 2 is flip-chip bonded to the substrate 1 via the bumps 3, as shown in FIG. 2B. With the chip 2 being located above the substrate 1, the substrate 1 has upwardly convex warpage due to the difference in thermal expansion coefficient between the chip 2 and the substrate 1. More specifically, since the substrate 1 has a higher thermal expansion coefficient than that of the chip 2, the thermal contraction stress of the substrate 1 is higher than the thermal contraction stress of the chip 2, and the substrate 1 has the upwardly convex warpage.

Figure 2C:
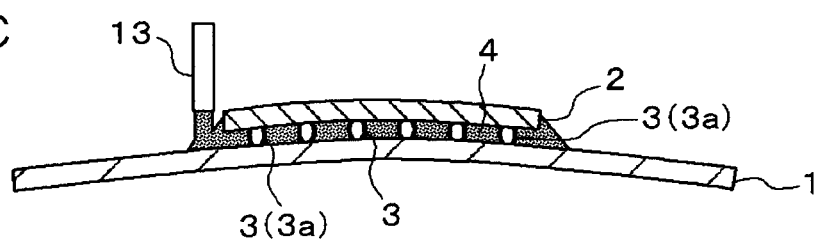

The first resin 4 is then injected between the substrate 1 and the chip 2, as shown in FIG. 2C. This injection is performed through a first injection nozzle 13 formed with a needle, for example. This injecting operation is performed by discharging the first resin 4 from the first injection nozzle 13 while moving the first injection nozzle 13 along one of the sides of the chip 2 or two adjacent sides of the chip 2. Alternatively, with the first injection nozzle 13 being fixed to a location near the chip 2, the injecting operation may be performed by discharging the first resin 4 from the first injection nozzle 13.

Here, as the preprocessing for the operation to inject the first resin 4, a flux cleaning process, a substrate drying process, or a plasma cleaning is carried out, or all of those processes are carried out if necessary, depending on the type of the bumps 3, whether or not flux is used at the time of the flip-chip bonding, and the type of the flux.

The injection of the first resin 4 is performed to cover the respective bumps 3. However, if the amount of the sticking-out portion of the first resin 4 sticking out of the chip 2 is large, the amount of the second resin 5 to be injected later becomes relatively smaller, and the warpage correcting effect of the thermal contraction stress of the second resin 5 becomes smaller. Therefore, the amount of the sticking-out portion of the first resin 4 should preferably be minimized. For example, the maximum value of the sticking-out width W (FIG. 1A) of the first resin 4 sticking out of the end faces of the chip 2 should preferably be equal to or less than 800 μm.

Figure 2D:
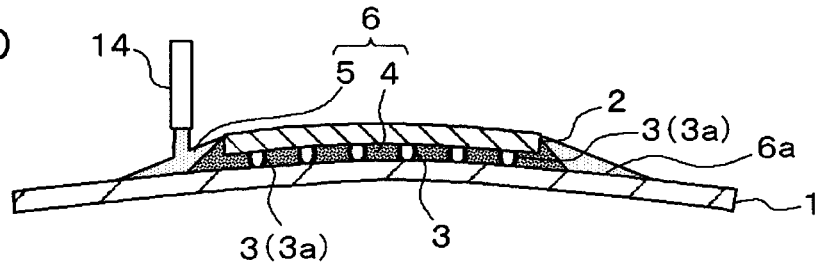

The second resin 5 is then formed by applying it to the surrounding sides (the outer sides) of the first resin 4, as shown in FIG. 2D. This formation is also performed through a second injection nozzle 14 formed with a needle, for example. This formation is performed by discharging the second resin 5 through the second injection nozzle 14 while moving the second injection nozzle 14 along the four sides of the chip 2, for example.

As the preprocessing for the formation of the second resin 5, the first resin 4 may be hardened, or plasma cleaning after the hardening may be performed.

The second resin 5 is then hardened, or the first resin 4 and the second resin 5 are hardened. As a result, the structure illustrated in FIG. 2E is obtained.

Here, the hardening of the first resin 4 and the second resin 5 may be thermal hardening in the air or a nitrogen atmosphere at 100 to 200° C., for example. For the first resin 4, it is possible to use a resin that hardens on contact with ultraviolet rays or the like, and the hardening in such a case can be performed by exposure of the resin to ultraviolet rays.

Figure 2E:
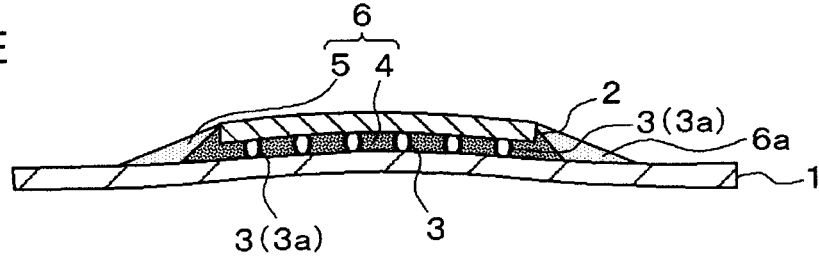

In the stage of FIG. 2E, the warpage of the substrate 1 is already smaller than that observed in the semiconductor device disclosed in Japanese Laid-Open Patent Publication No. 08-195414, and the warpage remains in the semiconductor device 10 that will be produced eventually.

After the stage of FIG. 2E, the BGA balls 7 (FIG. 1A) are attached to the back face of the substrate 1, to complete the semiconductor device 10 illustrated in FIGS. 1A and 1B.

Next, a method for mounting the semiconductor device 10 on a mounting substrate (not shown) is described.

To mount the semiconductor device 10 on the mounting substrate, the semiconductor device 10 is adsorptively held by the mounting tool of the mounting device, and is pushed into the flux container (not shown) of the mounting device, to attach flux to the BGA balls 7. Flux is stored beforehand in the flux container.

In this embodiment, the warpage of the substrate 1, which is the warpage of the semiconductor device 10, is sufficiently restrained, and flux can be easily and uniformly attached to the respective BGA balls 7. Accordingly, the semiconductor device 10 can be mounted on the mounting substrate so that the respective BGA balls 7 can be connected to the mounting substrate in good condition.

Thus, the device yield after the mounting and the device quality after the mounting can be improved.

According to the first embodiment described above, where the thermal expansion coefficient of the substrate 1 is higher than the thermal expansion coefficient of the first resin 4, the thermal contraction stress of the second resin 5 is made higher than the thermal contraction stress of the first resin 4. By doing so, the effect to correct at ordinary temperature the warpage of the substrate 1 caused by the flip-chip bonding is made greater than that achieved by the technique disclosed in Japanese Laid-Open Patent Publication No. 08-195414. Since the flatness of the substrate 1 can be improved, the semiconductor device 10 can be suitably mounted. More specifically, since the coplanarity of the BGA balls 7 formed on the substrate 1 can be made lower, flux can be attached evenly to the respective BGA balls 7 when the semiconductor device 10 is mounted, and preferred mounting can be performed. Accordingly, defective mounting of the semiconductor device 10 can be restrained, and the reliability of the mounting of the semiconductor device 10 is improved.

Since the first resin 4 is formed in the formation region of the bumps 3a formed on the outermost circumference of the bumps 3 and is also formed inside the formation region, the joining portions including the bumps 3a between the chip 2 and the substrate 1 are covered with the same resin, which is the first resin 4. With this arrangement, the stress to be applied to the joining portions due to the difference in thermal expansion coefficient between resins can be reduced, which cannot be achieved where two kinds of resins having different thermal expansion coefficients from each other are in contact with the same bump joining portion at both sides.

As described above, since the first resin 4 and the second resin 5 have different characteristics from each other in this embodiment, warpage of the substrate 1 can be corrected, and the joining portions can be protected in a preferred manner. In other words, both the reliability of the electric connection between the chip 2 and the substrate 1 and the reliability of the mounting of the semiconductor device 10 can be made higher.

[Second Embodiment]

Figure 3A:
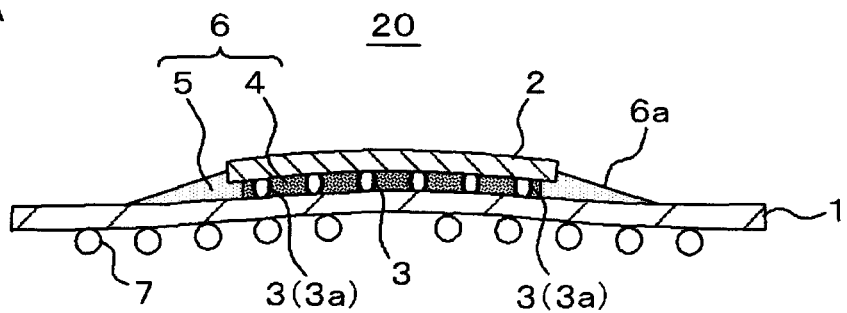
FIG. 3A is a schematic front cross-sectional view of a semiconductor device according to a second embodiment.
Figure 3B:
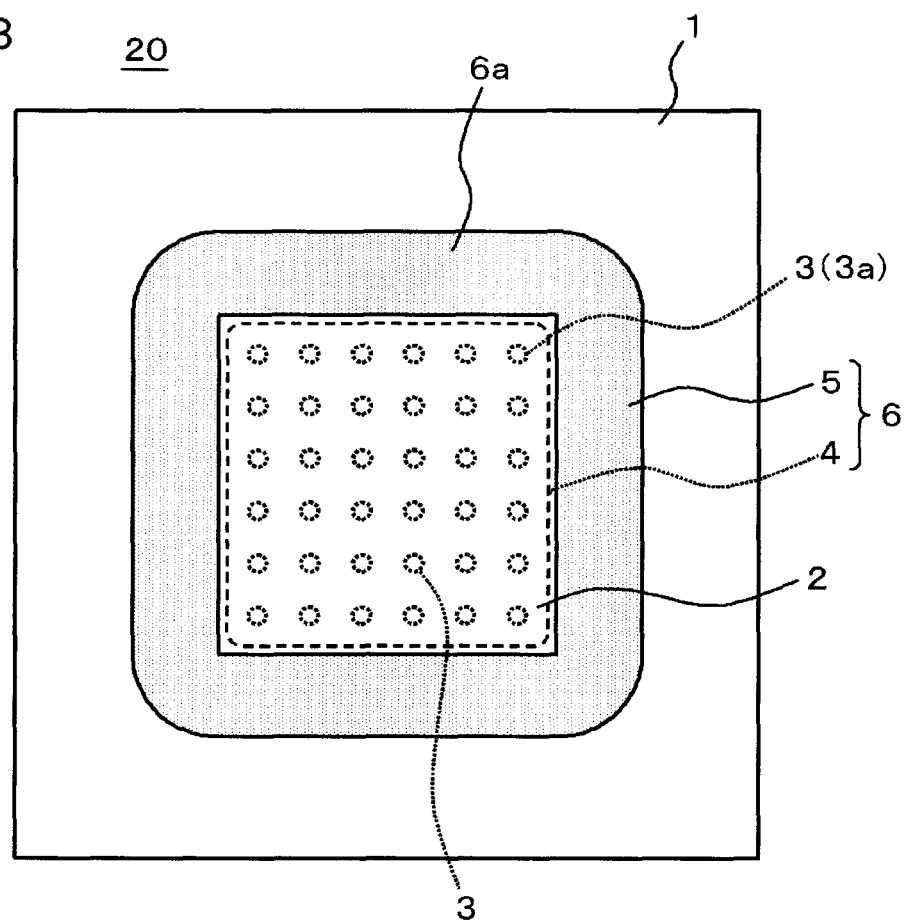
FIG. 3B is a schematic plan view of the semiconductor device according to the second embodiment.

FIGS. 3A and 3B are schematic views showing the structure of a semiconductor device 20 according to a second embodiment. FIG. 3A is a front cross-sectional view, and FIG. 3B is a plan view. FIGS. 4A through 4E are a series of process drawings (cross-sectional views) for explaining a method for manufacturing the semiconductor device according to the second embodiment.

A method for manufacturing the semiconductor device 20 according to this embodiment differs from the manufacturing method according to the first embodiment. In this embodiment, the first resin 4 is supplied (or placed) onto the substrate 1 prior to the flip-chip bonding, and after the flip-chip bonding, the second resin 5 is supplied. Accordingly, not only a liquid resin that is supposedly used in the first embodiment, but also a film-type resin may be used as the first resin 4.

Referring now to FIGS. 4A through 4E, the method for manufacturing the semiconductor device according to this embodiment is described in greater detail.

Figure 4A:
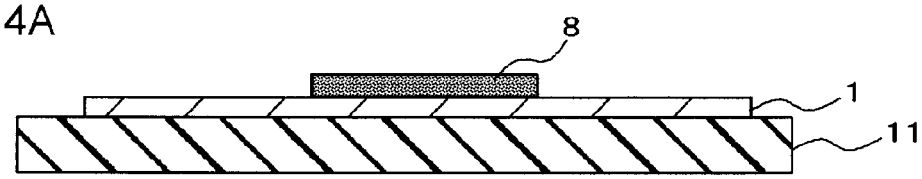
FIGS. 4A through 4E are a series of process drawings (cross-sectional views) for explaining a method for manufacturing the semiconductor device according to the second embodiment.

FIG. 4A shows the situation where the substrate 1 is placed on the substrate heating stage 11, with the interconnect face of the substrate 1 facing upward. In this embodiment, prior to the flip-chip bonding, a resin 8 having a film-like form is bonded onto the interconnect face of the substrate 1. The resin 8 may be bonded to the substrate 1 before or after the substrate 1 is placed on the substrate heating stage 11. The resin 8 will later form the first resin 4.

Figure 4B:
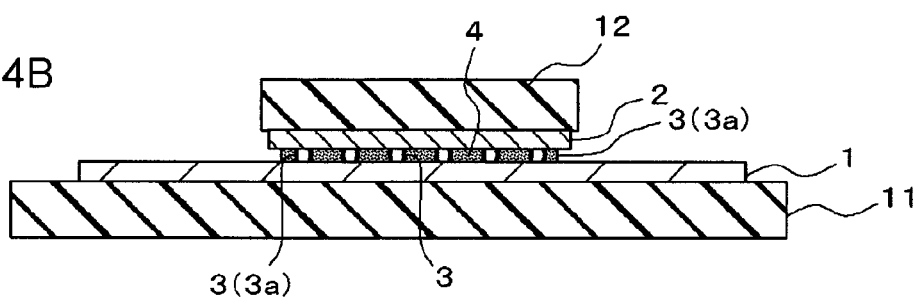

As shown in FIG. 4B, the chip 2 having the bumps 3 formed beforehand on its surface (its interconnect face) is adsorptively held by the chip heating tool 12, with the interconnect face of the chip 2 facing downward. The chip heating tool 12 is then moved down toward the substrate 1. By doing so, the bumps 3 of the chip 2 are brought into pressure contact with the electrode pads (any of which is not shown in the drawings) on the interconnects of the substrate 1. Further, in this situation, the chip heating tool 12 heats the chip 2, and the substrate heating stage 11 heats the substrate 1.

Figure 4C:
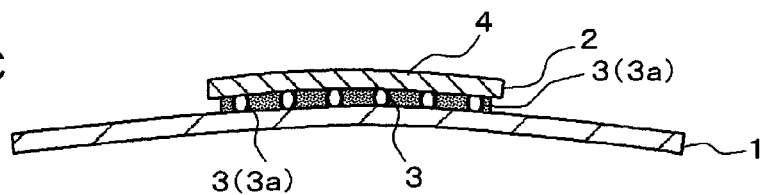

In this manner, the chip 2 is flip-chip bonded to the substrate 1 via the bumps 3, as shown in FIG. 4C. Since the resin 8 melts as the flip-chip bonding is performed, the first resin 4 fills the spaces between the substrate 1 and the chip 2. The amount of the resin 8 is suitably set in advance so that the respective bumps 3 are covered with the first resin 4.

In this embodiment, the resin 8 does not necessarily have a film-like form, but may be a material to which a liquid resin is applied, or a material formed by applying a liquid resin thereto and partially hardening the liquid resin.

Figure 4D:
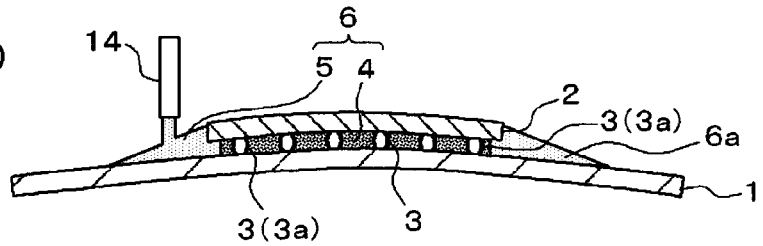

FIG. 4C shows an example case where the first resin 4 stays inside the end faces of the chip 2. In this example case, the fillet 6a is formed by part of the second resin 5 (FIG. 4D). However, the first resin 4 might stick out of the end faces of the chip 2, depending on the supplied amount of the resin 8 or the process conditions. In that case, the fillet 6a is formed with part of the first resin 4 and part of the second resin 5 as in the first embodiment. However, the amount of the sticking-out portion of the first resin 4 sticking out of the end faces of the chip 2 should preferably be smaller, as mentioned in the first embodiment.

Where the flip-chip bonding is performed in the above manner, the substrate 1 has upwardly convex warpage due to the difference in thermal expansion coefficient between the chip 2 and the substrate 1, with the chip 2 being placed on the substrate 1. More specifically, since the thermal expansion coefficient of the substrate 1 is higher than the thermal expansion coefficient of the chip 2, the thermal contraction stress of the substrate 1 is higher than the thermal contraction stress of the chip 2, and the substrate 1 has the upwardly convex warpage.

The second resin 5 is then applied and formed, as shown in FIG. 4D. The formation of the second resin 5 is the same as that of the first embodiment. Prior to the formation of the second resin 5, preprocessing may be performed by hardening the first resin 4 or performing plasma cleaning or the like as in the first embodiment.

The second resin 5 is then hardened, or the first resin 4 and the second resin 5 are hardened, as in the first embodiment. As a result, the structure illustrated in FIG. 4E is obtained.

Figure 4E:
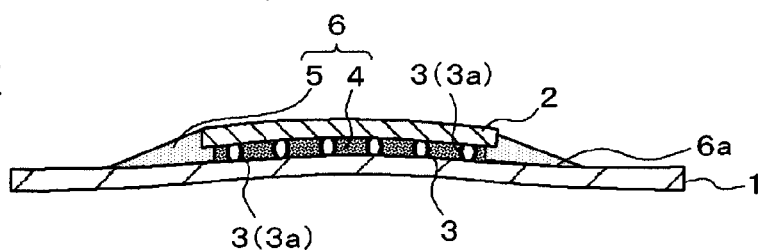

In the stage of FIG. 4E, the warpage of the substrate 1 is already smaller than that observed in the semiconductor device disclosed in Japanese Laid-Open Patent Publication No. 08-195414, and the warpage remains in the semiconductor device 10 that will be produced eventually.

After the stage of FIG. 4E, the BGA balls 7 (FIG. 3A) are attached to the back face of the substrate 1, to complete the semiconductor device 20 illustrated in FIGS. 3A and 3B.

According to the above described second embodiment, not only the same effects as those of the first embodiment but also the following effects are achieved.

If the space between the chip 2 and the substrate 1 is narrow in the first embodiment, particularly, in the semiconductor device 20 having a space smaller than 20 μm formed between the chip 2 and the substrate 1, there is increased difficulty in injecting the first resin 4, and voids (air bubbles) are easily formed in the lower face of the chip 2, for example. In the second embodiment, on the other hand, the resin 8 is supplied onto the substrate 1 in advance. Accordingly, the first resin 4 can fill the space between the chip 2 and the substrate 1, while formation of voids is suitably restrained.

Likewise, if the pitch of the joining portions (the pitch of the bumps 3) is narrow in the first embodiment, it is difficult, in some cases, to thoroughly spread the first resin 4 in liquid form among the joining portions. In the second embodiment, on the other hand, the first resin 4 can easily and thoroughly fill the spaces among the narrow-pitch joining portions, since the resin 8 is supplied onto the substrate 1 in advance. Particularly, if the resin 8 having a film-like form is supplied (attached) onto the substrate 1 in advance, the above effect becomes even more remarkable.

[Third Embodiment]

Figure 5A:
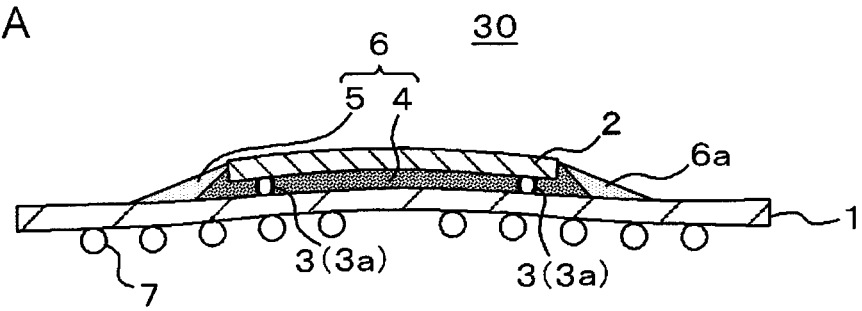
FIG. 5A is a schematic front cross-sectional view of a semiconductor device according to a third embodiment.
Figure 5B:
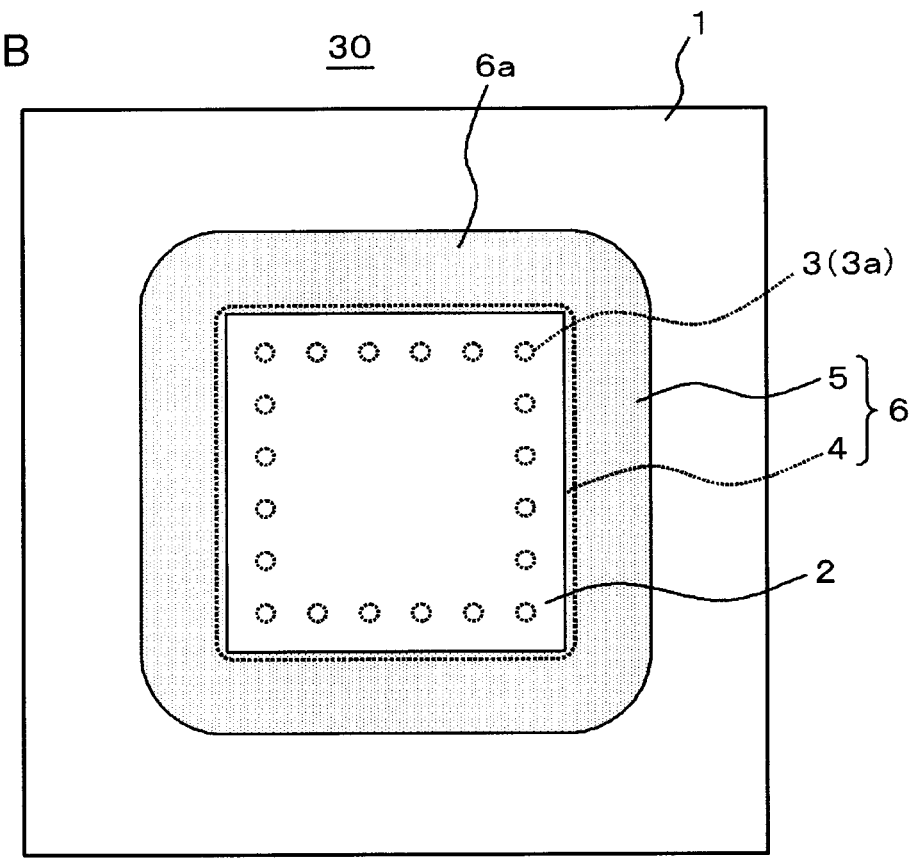
FIG. 5B is a schematic plan view of the semiconductor device according to the third embodiment.

FIGS. 5A and 5B are schematic views showing a semiconductor device 30 according to a third embodiment. FIG. 5A is a front cross-sectional view, and FIG. 5B is a plan view.

As shown in FIGS. 5A and 5B, this embodiment differs from the first embodiment in the arrangement of the bumps 3. In the first and second embodiments, the bumps 3 are arranged in the so-called "area-arrangement" manner in the plane of the chip 2. In this embodiment, on the other hand, the bumps 3 are arranged along the peripheral portion of the chip 2 (arranged in a so-called "peripheral-arrangement" manner).

The other aspects of the semiconductor device 30 according to this embodiment are the same as those of the first or second embodiment, and the semiconductor device 30 achieves the same effects as those of the first or second embodiment.

[Fourth Embodiment]

FIGS. 6A and 6B are schematic views showing a semiconductor device 40 according to a fourth embodiment. FIG. 6A is a front cross-sectional view, and FIG. 6B is a plan view. In FIG. 6B, a sealing resin 41 is not shown, to clearly show the positional relationships among respective components.

As shown in FIG. 6A, the semiconductor device 40 according to this embodiment has the sealing resin 41. More specifically, in this embodiment, the semiconductor device 40 includes the sealing resin 41 of a one-side sealing type that seals the chip 2 and the resin 6 (the portion of the resin 6 sticking out of the space between the chip 2 and the substrate 1). The sealing resin 41 is formed on the substrate 1, so as to cover the chip 2 and the resin 6 (the portion of the resin 6 sticking out of the space between the chip 2 and the substrate 1).

Here, the sealing resin 41 is preferably made of a thermosetting resin that has a higher thermal expansion coefficient than the thermal expansion coefficient of the substrate 1. With this arrangement, the effect to correct the warpage of the substrate 1 can be made greater than that of the first embodiment, when the sealing resin 41 is cooled to ordinary temperature after the thermal hardening of the sealing resin 41.

The other aspects of the semiconductor device 40 according to this embodiment are the same as those of the semiconductor device 10 or 20 (FIGS. 1A and 1B or 3A and 3B) according to the first or second embodiment.

The fourth embodiment can achieve the same effects as those of the first or second embodiment.

In this embodiment, the sealing resin 41 is made of a thermosetting resin that has a higher thermal expansion coefficient than the thermal expansion coefficient of the substrate 1. Accordingly, the effect to correct the warpage of the substrate 1 can be made greater than that of the first and second embodiments, and the flatness of the substrate 1 can be made higher than that of the first and second embodiments.

[Fifth Embodiment]

Figure 7A:
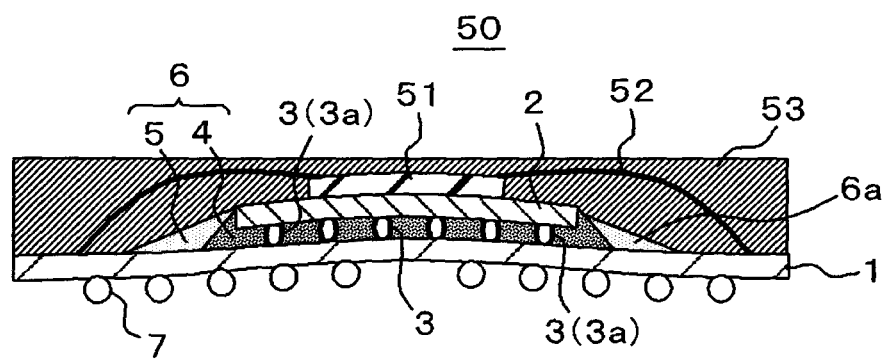
FIG. 7A is a schematic front cross-sectional view of a semiconductor device according to a fifth embodiment.
Figure 7B:
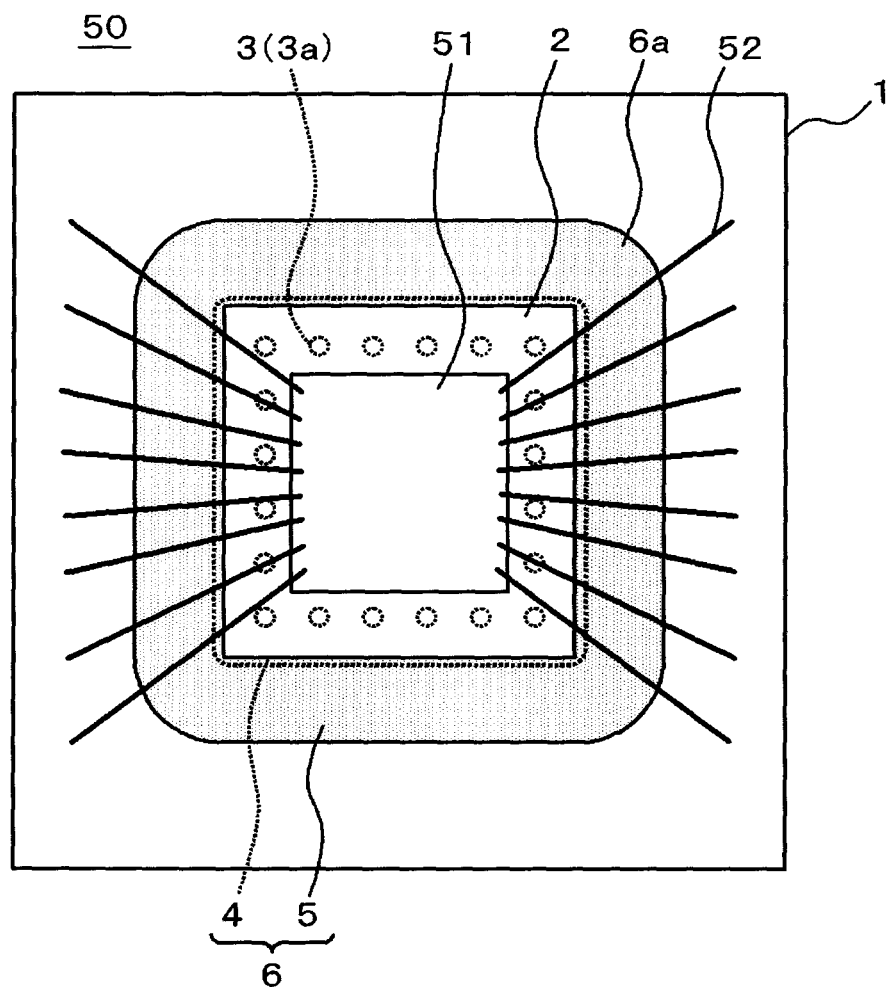
FIG. 7B is a schematic plan view of the semiconductor device according to the fifth embodiment.

FIGS. 7A and 7B are schematic views showing a semiconductor device 50 according to a fifth embodiment. FIG. 7A is a front cross-sectional view, and FIG. 7B is a plan view. In FIG. 7B, a sealing resin 53 is not shown, to clearly show the positional relationships among respective components.

As shown in FIGS. 7A and 7B, in the semiconductor device 50 according to this embodiment, a second chip 51 is mounted on the back face (the face on the opposite side from the device formation face) of the chip 2. The second chip 51 and the substrate 1 are electrically connected to each other by wire bonding with the use of thin metal wires made of Au or Cu or the like, or bonding wires 52.

To protect the bonding wires 52 and their bonding portions or wire-bonding portions from outside environments, the upper face side of the semiconductor device 50 is sealed with the sealing resin 53 of a one-side sealing type. The sealing resin 53 is formed on the substrate 1, so as to cover the chip 2, the resin 6 (the portion of the resin 6 sticking out of the space between the chip 2 and the substrate 1), the second chip 51, and the wire-bonding portions (the bonding wire 52 and their bonding portions).

In this embodiment, the sealing resin 53 is preferably made of a thermosetting resin that has a higher thermal expansion coefficient than the thermal expansion coefficient of the substrate 1 as in the fourth embodiment. With this arrangement, the effect to correct the warpage of the substrate 1 can be made greater than that of the first and second embodiments, when the sealing resin 53 is cooled to ordinary temperature after the thermal hardening of the sealing resin 53.

The other aspects of the semiconductor device 50 according to this embodiment are the same as those of the semiconductor device 10 or 20 (FIGS. 1A and 1B or 3A and 3B) according to the first or second embodiment.

The fifth embodiment can achieve the same effects as those of the first or second embodiment.

In this embodiment, the sealing resin 53 is made of a thermosetting resin that has a higher thermal expansion coefficient than the thermal expansion coefficient of the substrate 1. Accordingly, the effect to correct the warpage of the substrate 1 can be made greater than that of the first and second embodiments, and the flatness of the substrate 1 can be made higher than that of the first and second embodiments.

[Sixth Embodiment]

Figure 8A:
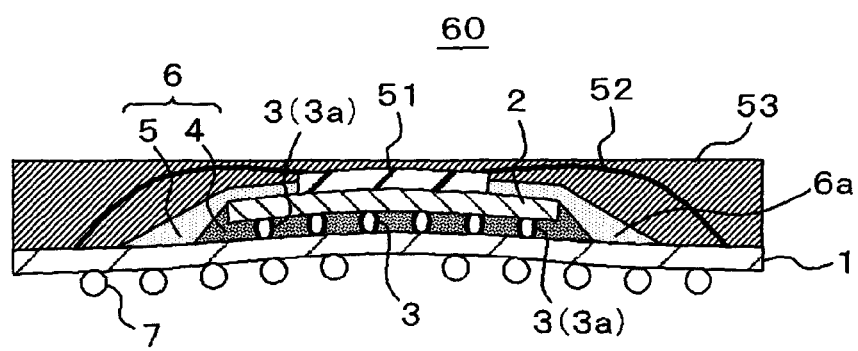
FIG. 8A is a schematic front cross-sectional view of a semiconductor device according to a sixth embodiment.
Figure 8B:
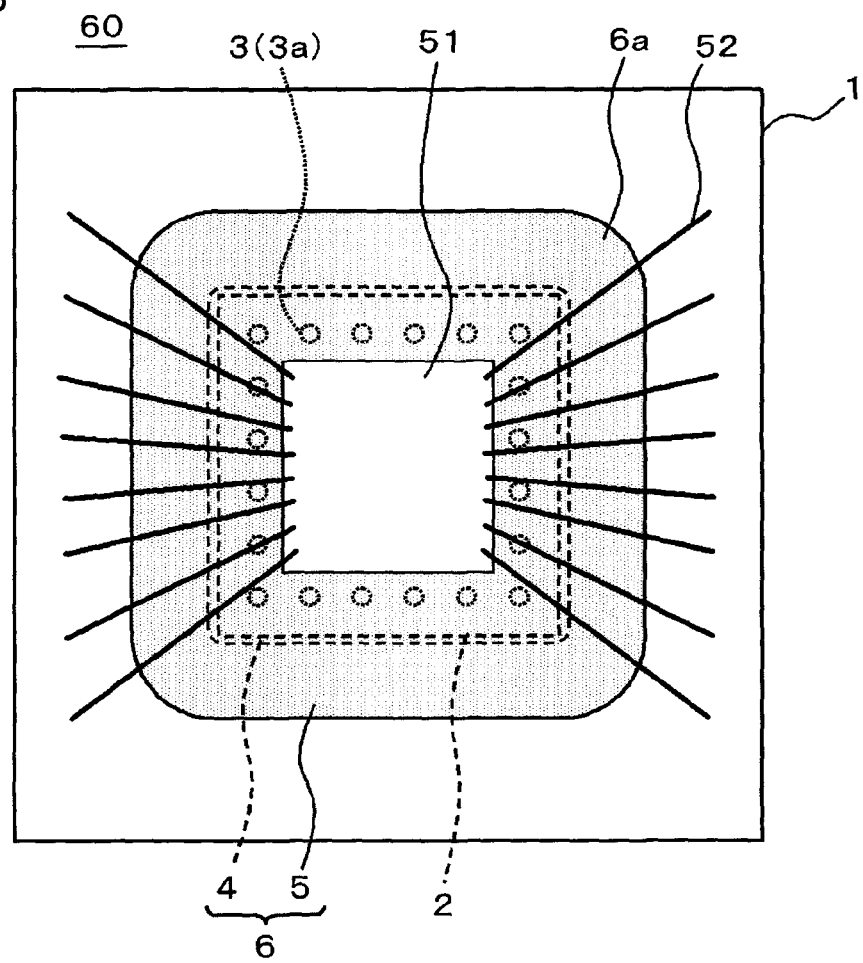
FIG. 8B is a schematic plan view of the semiconductor device according to the sixth embodiment.

FIGS. 8A and 8B are schematic views showing a semiconductor device 60 according to a sixth embodiment. FIG. 8A is a front cross-sectional view, and FIG. 8B is a plan view. In FIG. 8B, the sealing resin 53 is not shown, to clearly show the positional relationships among respective components.

As shown in FIGS. 8A and 8B, in this embodiment, the second resin 5 is formed to extend from the outside of the first resin 4 to the upper face of the chip 2. The second resin 5 even covers the portion of the chip 2 in the vicinity of the second chip 51, or the end faces of the second chip 51. In the example case illustrated in FIG. 8, the second resin 5 even covers the end faces of the second chip 51.

In this embodiment, the thermal expansion coefficient of the second resin 5 is preferably higher than the thermal expansion coefficient of the sealing resin 53. With this arrangement, the thermal contraction stress of the second resin 5 becomes higher than the thermal contraction stress of the sealing resin 53. Accordingly, the effect to correct the warpage of the substrate 1 can be made greater than that of the fifth embodiment.

The other aspects of the semiconductor device 60 according to this embodiment are the same as those of the semiconductor device 50 (FIGS. 7A and 7B) according to the fifth embodiment.

The sixth embodiment can achieve the same effects as those of the fifth embodiment.

In this embodiment, the thermal expansion coefficient of the second resin 5 is made higher than the thermal expansion coefficient of the sealing resin 53. Accordingly, the effect to correct the warpage of the substrate 1 can be made greater than that of the fifth embodiment, and the flatness of the substrate 1 can be made higher than that of the fifth embodiment.

Although the resin 8 is supplied (placed) beforehand onto the substrate 1 in the second embodiment, the resin 8 may be supplied (placed) beforehand onto the device formation face of the chip 2. To place the resin 8 beforehand onto the device formation face of the chip 2, the resin 8 having a film-like form should be bonded to the device formation face, or a resin in liquid form should be applied to the device formation face and be then partially hardened. Such a resin may be supplied (placed) onto both the substrate 1 and the chip 2 in advance.

Although the second chip 51 is formed with one layer in the fifth and sixth embodiments, second chips may be stacked on the chip 2 to be flip-chip bonded. In such a case, the same effects as those of the fifth or sixth embodiment can be achieved.

In the fourth embodiment (FIGS. 6A and 6B), the second resin 5 may be formed to extend from the outside of the first resin 4 to the upper face of the chip 2 as in the sixth embodiment (FIGS. 8A and 8B). In this case, the thermal expansion coefficient of the second resin 5 is made higher than the thermal expansion coefficient of the sealing resin 41 as in the sixth embodiment. Accordingly, the effect to correct the warpage of the substrate 1 can be made greater than that of the fourth embodiment, and the flatness of the substrate 1 can be made higher than that of the fourth embodiment.

It is apparent that the present invention is not limited to the above embodiments, and may be modified and changed without departing from the scope and spirit of the invention.

What is claimed is:
1. A semiconductor device comprising:
a substrate;
a semiconductor chip that is bonded to one face of said substrate via a plurality of bumps, and has a device formation face facing said one face; and a resin that fills a space between said device formation face of said semiconductor chip and said one face of said substrate, said resin including:

a first resin that is formed in a formation region of the plurality of bumps placed on an outermost circumference of said plurality of bumps, and is formed inside said formation region; and a second resin that is formed outside said first resin, the second resin contacting said first resin, a thermal expansion coefficient of said substrate being higher than a thermal expansion coefficient of said first resin, a thermal expansion coefficient of said second resin being higher than said thermal expansion coefficient of said first resin, the thermal expansion coefficient of the second resin being $\alpha 1 > 40$ ppm/° C., $\alpha 2 > 150$ ppm/° C., with $\alpha 1$ being the linear expansion coefficient when a temperature is lower than Tg, and $\alpha 2$ being the linear expansion coefficient when the temperature is equal to or higher than Tg, achieved by a wt % content ratio of inorganic filler in the second resin being lower than that of the first resin or a maximum particle size of the inorganic filler in the second resin being smaller than that of the first resin, wherein, an outside perimeter of said first resin is located more inward than an outer perimeter of said semiconductor chip, and an inside perimeter of said second resin is located more inward than the outer perimeter of said semiconductor chip, the outside perimeter of said first resin contacting the inside perimeter of said second resin with an interface between said first and second resins being located below said semiconductor chip more inward than the outer perimeter of said semiconductor chip.

2. The semiconductor device according to claim 1, further comprising a sealing resin of a one-side sealing type that seals said semiconductor chip and said resin, wherein said sealing resin has thermosetting properties, and has a higher thermal expansion coefficient than said thermal expansion coefficient of said substrate.

3. The semiconductor device according to claim 2, wherein said second resin is formed to extend from an outside of said first resin to an upper face of said semiconductor chip, and said thermal expansion coefficient of said second resin is higher than a thermal expansion coefficient of said sealing resin.

4. The semiconductor device according to claim 2, further comprising one or more second semiconductor chips that are stacked on said semiconductor chip, wherein said sealing resin seals said one or more second semiconductor chips as well, said second resin is formed to extend from an outside of said first resin to an upper face of said semiconductor chip, and said thermal expansion coefficient of said second resin is higher than a thermal expansion coefficient of said sealing resin.

5. A method for manufacturing a semiconductor device, comprising:

bonding a semiconductor chip to a substrate via a plurality of bumps, with a device formation face of said semiconductor chip facing one face of said substrate; and filling a space between said device formation face of said semiconductor chip and said one face of said substrate with a resin, said filling said space including:

forming a first resin in a formation region of the plurality of bumps placed on an outermost circumference of said plurality of bumps and inside said formation region, said first resin having a lower thermal expansion coefficient than a thermal expansion coefficient of said substrate; and forming a second resin outside said first resin and contacting said first resin, said second resin having a higher thermal expansion coefficient than said thermal expansion coefficient of said first resin, the thermal expansion coefficient of the second resin being $\alpha 1 > 40$ ppm/° C., $\alpha 2 > 150$ ppm/° C., with $\alpha 1$ being the linear expansion coefficient when a temperature is lower than Tg, and $\alpha 2$ being the linear expansion coefficient when the temperature is equal to or higher than Tg, achieved by a wt % content ratio of inorganic filler in the second resin being lower than that of the first resin or a maximum particle size of the inorganic filler in the second resin being smaller than that of the first resin, wherein, an outside perimeter of said first resin is located more inward than an outer perimeter of said semiconductor chip, and an inside perimeter of said second resin is located more inward than the outer perimeter of said semiconductor chip, the outside perimeter of said first resin contacting the inside perimeter of said second resin with an interface between said first and second resins being located below said semiconductor chip more inward than the outer perimeter of said semiconductor chip.

6. The method according to claim 5, wherein said forming said first resin includes placing a material to form said first resin on at least one of said device formation face and said one of said faces prior to said bonding said semiconductor chip to said substrate.

7. The method according to claim 6, wherein said material to form said first resin is a film-like resin material.

8. A semiconductor device comprising:

a substrate;

a semiconductor chip that is bonded to one face of said substrate via a plurality of bumps, and has a device formation face facing said one face; and a resin that fills a space between said device formation face of said semiconductor chip and said one face of said substrate, said resin including:

a first resin that is formed in a formation region of the plurality of bumps placed on an outermost circumference of said plurality of bumps, and is formed inside said formation region; and a second resin that is formed outside said first resin, the second resin contacting said first resin, a thermal expansion coefficient of said substrate being higher than a thermal expansion coefficient of said first resin, and a thermal expansion coefficient of said second resin being higher than said thermal expansion coefficient of said first resin, the thermal expansion coefficient of the second resin being $\alpha 1 > 40$ ppm/° C., $\alpha 2 > 150$ ppm/° C., with $\alpha 1$ being the linear expansion coefficient when a temperature is lower than Tg, and $\alpha 2$ being the linear expansion coefficient when the temperature is equal to or higher than Tg, achieved by a wt % content ratio of inorganic filler in the second resin being lower than that of the first resin or a maximum particle size of the inorganic filler in the second resin being smaller than that of the first resin.

9. The semiconductor device according to claim 8, wherein an outside perimeter of said first resin is located more inward than an outer perimeter of said semiconductor chip, and
an inside perimeter of said second resin is located more inward than the outer perimeter of said semiconductor chip, the outside perimeter of said first resin contacting the inside perimeter of said second resin with an interface between said first and second resins being located below said semiconductor chip more inward than the outer perimeter of said semiconductor chip.

10. The semiconductor device according to claim 8, further comprising
a sealing resin of a one-side sealing type that seals said semiconductor chip and said resin,
wherein said sealing resin has thermosetting properties, and has a higher thermal expansion coefficient than said thermal expansion coefficient of said substrate.

11. The semiconductor device according to claim 10, wherein
said second resin is formed to extend from an outside of said first resin to an upper face of said semiconductor chip, and
said thermal expansion coefficient of said second resin is higher than a thermal expansion coefficient of said sealing resin.

12. The semiconductor device according to claim 10, further comprising
one or more second semiconductor chips that are stacked on said semiconductor chip,
wherein
said sealing resin seals said one or more second semiconductor chips as well,
said second resin is formed to extend from an outside of said first resin to an upper face of said semiconductor chip, and
said thermal expansion coefficient of said second resin is higher than a thermal expansion coefficient of said sealing resin.

13. The semiconductor device according to claim 1, wherein
the chip has a thermal expansion coefficient $\alpha$ of 3 to 5 ppm/° C. and an elastic modulus of 130 GPa, and
the substrate has a thermal expansion coefficient of $\alpha 1$ of 15 to 25 ppm/° C. and $\alpha 2$ of 5 to 35 ppm/° C., a Tg of 120 to 150° C. and an elastic modulus of 15 to 30 GPa.

14. The method according to claim 5, wherein
the chip has a thermal expansion coefficient $\alpha$ of 3 to 5 ppm/° C. and an elastic modulus of 130 GPa, and
the substrate has a thermal expansion coefficient of $\alpha 1$ of 15 to 25 ppm/° C. and $\alpha 2$ of 5 to 35 ppm/° C., a Tg of 120 to 150° C. and an elastic modulus of 15 to 30 GPa.

15. The semiconductor device according to claim 8, wherein
the chip has a thermal expansion coefficient $\alpha$ of 3 to 5 ppm/° C. and an elastic modulus of 130 GPa, and
the substrate has a thermal expansion coefficient of $\alpha 1$ of 15 to 25 ppm/° C. and $\alpha 2$ of 5 to 35 ppm/° C., a Tg of 120 to 150° C. and an elastic modulus of 15 to 30 GPa.

* * * * *